United States Patent [19]

Hoshino et al.

[11] Patent Number: 4,898,656

[45] Date of Patent: Feb. 6, 1990

[54] ELECTRODEPOSITION COATING PROCESS OF PHOTORESIST FOR PRINTED CIRCUIT BOARD

[75] Inventors: Masahiro Hoshino, Kobe; Isao Kobayashi, Takarazuka; Kenji Seko, Yokosuka; Naozumi Iwasawa; Yuu Akaki, both of Hiratsuka; Toshio Kondo, Fujisawa, all of Japan

[73] Assignees: Kansai Paint Co., Ltd., Hyogo; Mitsubishi Denki Kabushiki Kaisha, Tokyo, both of Japan

[21] Appl. No.: 329,636

[22] Filed: Mar. 28, 1989

[30] Foreign Application Priority Data

| Mar. 28, 1988 | [JP] | Japan | 63-72083 |
| Apr. 22, 1988 | [JP] | Japan | 63-98400 |
| May 2, 1988 | [JP] | Japan | 63-109482 |
| Jul. 28, 1988 | [JP] | Japan | 63-187031 |

[51] Int. Cl.$^4$ .............................................. C25D 13/04
[52] U.S. Cl. ............................................... 204/181.1
[58] Field of Search ................ 204/180.6, 181.1, 181.4

[56] References Cited

U.S. PATENT DOCUMENTS 4,421,620 12/1983 Kaylo .............................. 204/181.1

Primary Examiner—T. M. Tufariello
Attorney, Agent, or Firm—Wenderoth, Lind & Ponack

[57] ABSTRACT

An electrodeposition coating process of a photoresist for printed circuit board which comprises electrodeposition coating on a conductive surface a photosensitive electrodeposition coating composition (A), and thereafter further electrodeposition coating on the resultant coated plate an electrodeposition coating composition (B) composed chiefly of water-soluble or water-dispersible resin having a glass transition temperature (Tg) not lower than 20° C.

16 Claims, No Drawings

ELECTRODEPOSITION COATING PROCESS OF PHOTORESIST FOR PRINTED CIRCUIT BOARD

This invention relates to an electrodeposition coating process of photoresist for printed circuit board.

More specifically, the invention relates to a 2-coat electrodeposition process of photoresist for printed circuit board, which enables formation of smooth and uniform coating free from surface tackiness on a conductive surface such as copper plating board, and also easy formation of images free from such defects as broken lines or uneven line width.

Nagative-acting photoresists for printed circuit board have been obtained heretofore utilizing photo curable coating obtained by electodeposition coating, in which a uniform coating capable of being developed and forming excellent images is formed on a conductive surfaces (e.g., U.S. Pat. No. 3,954,587 and 4,592,816, etc).

Also, a positive-acting photoresists for printed circuit board have been obtained utilizing photo acid generating coating applied by electrodeposition, in which a uniform coating capable of being developed and forming excellent images is formed on a conductive surface (e.g., U.S. Pats. No. 4,632,900; 4,673,458; etc.).

Those photoresists, however, are obtained by 1-coat electrodeposition coating, and in order to avoid adhesion of the coating with negative or positive films during contact exposure, it is necessary to raise the glass transition temperature of the resins composing the photoresists. This tends to invite such problems as an increase in resistance of the coating during the electrodeposition, which renders thickening of the coating impossible, or deterioration in curability of the coating with active rays irradiation because chain transfer at the time of exposure is hampered.

In case of electrodeposition type positive-acting photoresists, unexposed areas of the coating also have polar groups such as carboxyl or amino groups. This causes a problem that the difference in solubility in developer liquids between exposed areas and unexposed areas is less, compared with solvent-type positive-acting resists and electodeposition type negative-acting photoresists. Consequently, in order to obtain good printed-circuit boards using electrodeposition coating type positive-acting photoresists, it is required to precisely control surface characteristics of the photoresist or development condition., e.g., to uniformize thickness of the coating film.

Furthermore, in occasions of forming photoresists by electrodeposition coating process, the formed photoresists are normally washed with water and marks of waterdrops remain on the coating surfaces. In actual industrial processing lines, however, it is difficult to completely remove the marks. Consequently the coating on the spots on which the marks are remaining becomes less in thickness compared with the rest of the coating, and resultant photoresist fails to serve as a satisfactory protective coating during the developing and etching steps, which often invites such problems on the finished printed circuit board as breaking or narrowing of lines.

In the actual industrial processing lines various counter measures are taken to prevent the water-drop marks, such as air-blowing the products after the rinsing or using specially devised transfer apparatus, but none has proven completely effective. Besides, such counter measures cause an increase in equipment or operation costs.

We have engaged in exhaustive studies in the purpose of finding a technical means to solve above problems and now discovered that the problems can be completely solved by forming photoresists by 2-coat electrodeposition coating process. Thus the present invention is completed.

According to the present invention, an electrodeposition coating process of photoresist for printed circuit board is provided, which comprises electrodepositing on a conductive surface a photosensitive electrodeposition coating composition (A), and thereafter further electrodepositing on the resulting coating film electrodepositing an electrodeposition coating composition (B) composed mainly of a water-soluble or water-dispersible resin having a glass transition temperature of at least 20° C.

The photosensitive electrodeposition coating composition (A) to be employed in the present invention is basically a composition containing as the main ingredients a resin having salt-forming groups for imparting solubility or dispersibility in water, and photosensitive groups. This composition can be classified into negative type and positive type. Hereinafter these compositions will be explained in details.

Negative type electrodeposition coating compositions (A)

These are known anionic or cationic electrodepositable compositions containing as main components water-soluble or water-dispersible, polymerizable unsaturated resins and photo-polymerization initiators. The polymerizable unsaturated resins employed in the compositions are under no critical limitation, so long as they are water-soluble or dispersible resins containing anionic or cationic groups.

As typical examples, the anionic resins selected from following groups (1) to (5) may be named.

(1) A resin composition composed of a polymerizable unsaturated resin obtained by adding a reaction product of a compound containing a polymerizable unsaturated bond and a hydroxy group per molecule and a diisocyanate compound, to a high acid value acrylic resin having hydroxyl groups in its skeletal structure; or a composition composed chiefly of the above resin and an ethylenically unsaturated compound containing per molecule at least one polymerizable unsaturated bond:

Examples of the compounds containing polymerizable unsaturated bonds and hydroxyl groups include 2-hydroxyethyl acrylate, 2-hydroxyethyl methacrylate, 2-hydroxypropyl acrylate, N-methylolacrylamide, allyl alcohol, methallyl alcohol and the like; and diisocyanate, compounds include tolylene diisocyanate, xylene diisocyanate, hexamethylene diisocyanate, isophorone diisocyanate and lysine diisocyanate, etc.

Hydroxyl groups can be introduced into high acid value acrylic resins by use of the compound containing per molecule a polymerizable unsaturated bond and hydroxyl group as a co-polymerizing component. The carboxyl groups can be imparted by co-polymerizing an unsaturated acid such as acrylic acid or methacrylic acid with other polymerizable unsaturated monomers. The urethanation reaction of the compound containing a polymerizable unsaturated bond and a hydroxyl group in a molecule with a diisocyanate compound, and the addition reaction of the above reaction product with a high acid value acrylic resin containing hydroxyl groups in its skeletal structure can be conducted in the accepted manner.

(2) A resin composition composed chiefly of a mixture of a polymerizable, unsaturated resin obtained by adding an α, β-ethylenically unsaturated dibasic acid or an anhydride thereof to an unsaturated bond in a fatty acid chain in an esterified product of an epoxy resin containing epoxy groups and unsaturated fatty acid, with an ethylenically unsaturated compound containing at least one polymerizable, unsaturated bond per molecule:

Examples of unsaturated fatty acids include oleic acid, linolic acid, linolenic acid, eleostearic acid, licanic acid, ricinoleic acid and arachidonic acid. As α, β-ethylenically unsaturated acids or anhydrides thereof, for example, maleic acid, maleic anhydride, fumaric acid and itaconic acid may be named. The carboxyl group content of this resin component can be controlled by varying the adding amount of α, β-ethylenically unsaturated dibasic acid or its anhydride, and the unsaturation equivalent can be adjusted by varying the type and amount of unsaturated fatty acid employed.

(3) A resin composition composed chiefly of a mixture of a polymerizable unsaturated resin consisting of unsaturated fatty acid-modified alkyd resin having a high acid value, with an ethylenically unsaturated compound containing per molecule at least one polymerizable, unsaturated bond:

This polymerizable unsaturated resin is formed by an esterification of an unsaturated fatty acid with the hydroxyl groups contained in the skeleton of an esterified product of a mixture of a dibasic acid having two carboxyl groups per molecule and a polybasic acid having at least three carboxyl groups per molecule with a polyhydroxy compound (polyol) having at least two hydroxyl groups per molecule. In this case mol number of the di- and polybasic acid component/mol number of polyol component is preferably within the range of 0.8–1.0.

In the above reaction the carboxyl group content can be controlled by selecting the type and amount of polybasic acid, and unsaturation equivalent, by varying the amount of unsaturated fatty acid. Or, the carboxyl groups may be imparted by semi-esterifying the di- or polybasic acid with the unsaturated fatty acid-modified alkyd resin containing hydroxyl groups in excess of carboxyl groups. In such a system, examples of dibasic acids include phthalic anhydride, isophthalic acid, terephthalic acid, tetrahydrophthalic anhydride, maleic anhydride, fumaric acid, succinic acid, adipic acid and sebacic acid. Examples of polybasic acids include trimellitic acid, pyromellitic acid and pyromellitic anhydride. Examples of polyhydric alcohols include ethylene glycol, propylene glycol, butylene glycol, neopentyl glycol, glycerine, trimethylolethane, trimethylolpropane, pentaerythritol, sorbitol and diglycerol. As unsaturated fatty acids, those exemplified for the case of reacting with epoxy resins for preparation of the polymerizable, unsaturated resins of (2) above can be similarly used.

(4) A resin composition composed chiefly of a mixture of a polymerizable, unsaturated resin composed of maleinized oil and an ethylenically unsaturated compound containing at least one polymerizable unsaturated bond per molecule:

Maleinized oil includes the reaction products of oils having conjugated double bonds or non-conjugated double bonds with maleic anhydride. When styrene, vinyltoluene, cyclopentadiene, acrylic acid ester, methacrylic acid ester or the like is further added to these reaction products, curability of the coating is further improved. With those maleinized oils, carboxyl group content is adjusted by the adding amount of maleic anhydride, and unsaturation equivalent can be adjusted by the amount of unsaturated bonds contained in the oil. Examples of the oils include linseed oil, tung oil, soybean oil, castor oil, sardine oil, cottonseed oil and hempseed oil.

(5) A resin composition composed chiefly of a polymerizable, unsaturated resin formed by adding a compound containing a polymerizable, unsaturated bond and a glycidyl group in one molecule to a high acid value acrylic resin:

This polymerizable, unsaturated resin includes, for example, the resins formed by adding to high acid value acrylic resins obtained by co-polymerizing unsaturated acids such as acrylic acid, methacrylic acid or the like with other acrylic monomers, a compound having a polymerizable unsaturated bond and glycidyl group in one molecule such as glycidyl acrylate, glycidyl methacrylate, etc.

As typical examples of cationic resins, the following groups (6) to (10) may be named.

(6) A polymerizable unsaturated resin formed by adding a reaction product of a compound containing a polymerizable unsaturated bond and a hydroxyl group per molecule with a diisocyanate compound, to an acrylic resin containing in its skeletal structure a hydroxyl group and a tertiary amino group:

As the compound containing a polymerizable unsaturated bond and a hydroxyl group per molecule, for example, 2-hydroxyethyl acrylate, 2-hydroxyethyl methacrylate, 2-hydroxypropyl acrylate, N-methylolacrylamide, allyl alcohol, methallyl alcohol, and the like may be exemplified, and as the diisocyanate compound, tolylene diisocyanate, xylene diisocyanate, hexamethylene diisocyanate, lysine diisocyanate, etc. may be exemplified.

Hydroxyl groups may be introduced into acrylic resin skeleton by use of said compound having in one molecule a polymerizable unsaturated bond and a hydroxyl group as a co-polymerizing component. Again, introduction of tertiary amino group into acrylic resin skeleton can be effected by using as a co-polymerizing component a polymerizable unsaturated monomer having tertiary amino groups such as a dialkylaminoalkyl (meth)acrylate [e.g., dimethylaminoethyl meth(acrylate), diethylaminoethyl (meth)acrylate, dimethylaminopropyl (meth)acrylate or the like ] expressed by the general formula below:

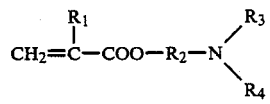

in which $R_1$ stands for hydrogen atom or methyl group; $R_2$ stands for a $C_{1-8}$ alkylene group, and $R_3$ and $R_4$ each stands for a $C_{1-4}$ alkyl group.

(7) A tertiary amino-containing unsaturated resin formed by first partially reacting epoxy groups in an epoxy resin containing at least two epoxy groups per molecule with a compound containing secondary amino groups, and thereafter reacting the remaining epoxy groups with a polymerizable unsaturated monocarboxylic acid such as (meth)acrylic acid, or a compound containing polymerizable unsaturated group and hydroxyl group within one molecule as exemplified in above (6):

Examples of epoxy resins include copolymers of a compound containing a polymerizable unsaturated group and glycidyl group in one molecule with another polymerizable unsaturated monomer; diglycidyl ethers of polyphenol such as bisphenol A, bisphenol F, etc., or reaction products of those with polyphenol, polyester, polyether polyol, etc.; polyglycidyl ethers of novolak phenol, novolak cresol-type epoxy resin, aliphatic polyepoxy resin, alicyclic polyepoxy resin; or those resins modified with polyester, polyether polyol or the like; or their mixtures.

As the compounds containing secondary amino groups, alkyl amines or aromatic amines (e.g., dimethylamine, diethylamine, di-n-propylamine, diphenylamine, etc.) of the general formula,

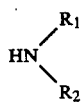

in which $R_1$ and $R_2$ each denotes $C_{1-18}$ alkyl or aromatic group,
and amines of the general formula below,

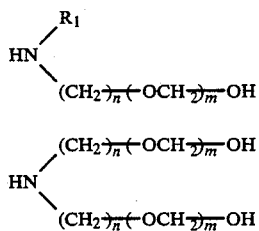

in which $R_1$ has a definition same as above; n is an integer of 1-18; and m is an integer of 0-20,
(e.g., n-methylethanolamine, diethanolamine, amine, etc.) may be exemplified.

(8) A tertiray amino group-containing unsaturated resin formed by reacting a copolymer resin with a polymerizable unsaturated monocarboxylic acid such as (meth)acrylic acid, or a compound containing polymerizable unsaturated group and hydroxyl group in one molecule as exemplified in above (6), said copolymer resin being that obtained by copolymerizing a compound containing in one molecule a polymerizable unsaturated group and glycidyl group e.g., glycidyl (meth)acrylate) and a compound containing per molecule a polymerizable unsaturated group and tertiary amino group [e.g., N,N-dimethylaminoethyl (meth)acrylate, N,N-diethylaminoethyl (meth)acrylate, N,N-diethylaminoethyl (meth)acrylate, N,N-dimethylaminopropyl (meth)acrylate, etc.] with another polymerizable monomer:

(9) An onium base-containing unsaturated resin obtained by first partially reacting epoxy groups of the epoxy resins exemplified in (7) above with a compound containing per molecule a polymerizable unsaturated group and carboxyl or hydroxyl group exemplified in above (6) and (7), and then converting the remaining epoxy groups to onium salt with a tertiary amino compound, thioether, phosphine, etc. and carboxylic acid:

(10) An onium base-containing unsaturated resin obtained by, instead of partially esterifying the epoxy groups and thereafter converting the product to an onium salt, simultaneously reacting with the epoxy resin a compound which contains in one molecule a polymerizable unsaturated group and carboxyl or hydoxyl group and an onium salt-forming compound such as the tertiary amino group-containing compound, thioether, phosphin, etc. and if necessary, carboxylic acid.

These resins can be each used singly or as mixtures of two or more.

Those polymerizable unsaturated resins useful for anionic electrodeposition coatings as represented by above (1) to (5) advantageously have the carboxyl group content in terms of acid value of 20-300 (preferably 40-110), and the polymerizable unsaturated resins useful for cationic electrodeposition coatings as represented by above (6) to (10) have tertiary amino group and/or onium salt content of 0.2-5 mols (preferably 0.3-2.0 mols) per 1 kg of the resin. They also advantageously have an unsaturation equivalent of 150-3,000 (preferably 150-1,000) per 1 kg of the resin and a number average molecular weight of at least 300 obtained by first partially reacting epoxy groups of the epoxy resins exemplified in (7) above with a compound containing per molecule a polymerizable unsaturated group and carboxyl or hydroxyl group exemplified in above (6) and (7), and then converting the remaining epoxy groups to onium salt with a tertiary amino compound, thioether, phosphine, etc. and carboxylic acid:

(10) An onium base-containing unsaturated resin obtained by, instead of partically esterifying the epoxy groups and thereafter converting the product to an onium salt, simultaneously reacting with the epoxy resin a compound which contains in one molecule a polymerizable unsaturated group and carboxyl or hydroxyl group and an onium salt-forming compound such as the tertiary amino group-containing compound, thioether, phosphin, etc. and if necessary, carboxylic acid.

These resins can be each used singly or as mixtures of two or more.

Those polymerizable unsaturated resins useful for anionic electrodeposition coatings as represented by above (1) to (5) advantageously have the carboxyl group content in terms of acid value of 20-300 (preferably 40-110), and the polymerizable unsaturated resins useful for cationic electrode position coatings as represented by above (6) to (10) have tertiary amino group and/or onium salt content of 0.2-5 mols (preferably 0.3-2.0 mols) per 1 kg of the resin. They also advantageously have an unsaturation equivalent of 150-3,000 (preferably 150-1,000) per 1 kg of the resin and a number average molecular weight of at least 300 (preferably 1,000-30,000).

Again, it is advantageous that the glass transition temperature (Tg) of those polymerizable unsaturated resins in unexposed state is within the range of $-50$ to 60° C. (preferably $-20$ to 40° C.). When Tg is lower than $-50°$ C., the coating formed upon electrodeposition becomes too soft, and the electric resistance of the film becomes too small to provide uniform coating. Conversely, when Tg is higher than 60° C., the electric resistance becomes too high, which renders provision of a thick coating difficult and also promotes the decreasing tendency in photosensitivity, as chain transfer at the time of exposure tends to be hampered.

According to the invention, the photopolymerization initiator to be used in combination with the unsaturated resins are subject to no particular limitation so long as they are capable of initiating radical polymerization under irradiation of activating light such as ultraviolet rays. Typical examples of such initiators are shown below: benzoin, benzoin methylether, benzoin ethylether, benzyl, diphenyldisulfide, tetramethylthiuram monosulfide, diacetyl, eosin, thionine, Michler's ketone, anthraquinone, chloroanthraquinone, methylanthraquinone, alpha-hydroxyisobutylphenone, p-isopropyl-alpha-hydroxyisobutylphenone, alpha, alpha'-dichloro-4-phenoxyacetophenone, 1-hydroxy-1-cyclohexylacetophenone, 2,2-dimethoxy-2-phenylacetophenone, methylbenzoylformate, 2-methyl-1-4-(methylthio)phenyl]-2-morpholino-propene, thioxanthone, benzophenone, etc. Those initiators are conveniently used in an amount of 0.1 to 10 parts by weight to 100 parts by weight of the resin component (as solid). If used in an amount less than 0.1 part by weight, curability is objectionably lowered, while if used in an amount more than 10 parts by weight, mechanical strength of the cured coating tends to deteriorate.

The ethylenically unsaturated compounds containing at least one polymerizable unsaturated bond per molecule which are used as an essential or optional component in the anionic unsaturated resins (1)–(5) include, for example, esters of (meth)acrylic acids such as methyl (meth)acrylate, ethyl (meth)acrylate, propyl (meth)acrylate, butyl (meth)acrylate, etc.; polyfunctional monomers such as ethylene glycol di(meth)acrylate, divinylbenzene, etc.; and styrene, (meth)acrylonitriles.

Positive type electrodeposition coating compositions
(A)

According to the present invention, positive type electrodeposition coating compositions to be used for forming positive type photoresist may be those known in the concerned art, which can be either anionic or cationic type. For example, those composed mainly of resins containing polyoxymethylene polymer, o-nitrocarbinol ester, o-nitrophenylacetal or benzo (or naphtho) quinonediazide units, which contain salt-forming groups to render the resins water-soluble or water-dispersible, and photosensitive groups may be named (e.g., see U.S. Pats. No. 3,954,587 and 4,592,816, Japanese Laid-open Pat. Application Laid-open No. 6070/88, Japanese Pat. Application Nos. 157841/87 and 157842/87 and U.S. Pat. Application Ser. No. 268547).

Such resins containing salt-forming groups and photosensitive groups to be used for the above positive type electrodeposition coating compositions contain 5–60 % by weight (preferably 10–50 % by weight) of photosensitive groups [e.g., benzo (or nophtho) quinonediazide units] based on the resin. Other than that, appropriate acid value, tertiary amino group and/or onium base content, number average molecular weight and Tg of those resins are same to those of the unsaturated resins represented by aforedescribed groups (1) to (10).

To the negative or positive type electrodeposition coating composition (A) to be employed in the present invention, besides aforesaid anionic or cationic resins, up to 100 parts by weight, preferably up to 50 parts by weight, per 100 parts by weight of said anionic or cationic resins, of polymerizable unsaturated groupcontaining resins (e.g., polyester acrylates, polyurethane resins, epoxy resins and acrylic resins, etc., containing ethylenically unsaturated groups), saturated resins (e.g., polyester resins, polyurethane resins, epoxy resins, acrylic resins, etc.) and oligomers [e.g., diethylene glycol di(meth)acrylates, etc.] may be blended to suitably adjust the coating performance.

The resins can be made water-soluble or dispersible in occasions of preparing the electrodeposition coating composition (A), when the resin contains acid radicals like carboxyl groups as introduced into its skeletal structure, by neutralizing the acid radicals with alkali (neutralizing agent), and when it contains amino groups as introduced therein, by neutralizing with an acid (neutralizing agent). Also, the onium salt-bearing resin can be made water-soluble or dispersible as it is.

Examples of alkali neutralizing agent include alkanolamines such as monoethanolamine, diethanolamine and triethanolamine; alkylamines such as triethylamine, diethylamine, monoethylamine, diisopropylamine, trimethylamine and diisobutylamine; alkylalkanolamines such as dimethylaminoethanol; alicyclic amines such as cyclohexylamine; alkali metal hydroxides such as sodium hydroxide and potassium hydroxide; and ammonia. Examples of acid neutralizing agent include monocarboxylic acids such as formic, acetic, lactic, hydroxyacetic and butyric acids, which can be used either singly or as mixtures. Preferred amount of use of such neutralizing agent is within the range of 0.2–1.0 equivalent per mol of the salt-forming groups contained in the skeleton.

In order to still improve flowability of the watersolubilized or dispersed resin component, hydrophilic solvents such as isopropanol, n-butanol, t-butanol, methoxyethanol, ethoxyethanol, butoxyethanol, diethylene glycol, methyl ether, dioxane, tetrehydrofuran, etc. may be added. The amount of use of such solvents is preferably not more than 300 parts by weight per 100 parts by weight of the vehicle component.

In order to increase film thickness of the coating on the material to be coated, hydrophobic solvents such as petroleum solvents, e.g., toluene, xylene; ketones, e.g., methyl ethyl ketone, methyl isobutyl ketone; esters, e.g., ethyl acetate, butyl acetate, etc.; and alcohols, e.g., 2-ethylhexyl alcohol, may also be added. The preferred amount of use of such a hydrophobic solvent is not more than 200 parts by weight per 100 parts by weight of the resin component.

Electrodeposition coating composition (B)

On the other hand, the resin component in the electrodeposition coating composition (B) to be used in the second coating may be a polymerizable unsaturated resin or a non-photocrosslinkable resin having no photosensitive groups, when the electrodeposition coating composition (A) is negative type. If the composition (A) is positive type, the composition (B) can be a positive type resin similar to that used in the composition (A) or aforesaid non-photocrosslinkable resin having no photosensitive groups. Those resins to be used in the electrodeposition coating composition (B) should have saltforming groups for making them water-soluble or -dispersible and also have Tg in unexposed state of at least 20° C. (preferably 40–120° C.). It is desirable to so select the resins that the Tg should become higher than that of the resin used in the composition (A) by at least 5° C. If Tg of the resin component used in the composition (B) is below 20° C., there results a defect that the coating adhere to the film after contact exposure, this tendency being more conspicuous when the ambient temperature is high in the working site.

The resin used in the composition (B) has a number average molecular weight of at least 300 (preferably 1,000–30,000), and if it is anionic type, has an acid value of 20–300 (preferably 40–110) and if it is cationic type, an amino group and/or onium salt content of 0.2–5.0 (preferably 0.3–2.0) mols/kg resin.

The unsaturated resins used in the composition (B) can be, for example, selected from the resins of (1) to (10) listed as to the composition (A), and the nonphoto-crosslinkable type resins having no photosensitive groups can be any of above resins (1) to (10) from which the polymerizable unsaturated groups, viz., ethylenically unsaturated groups are removed. When a negative type electrodeposition coating composition is used for the first coating of the present invention, the resin used in the composition (B) is preferably an unsaturated resin, because such resin prevents deterioration in photosensitivity of the first coating.

The electrodeposition coating composition (B) is prepared using above resin component and if necessary by adding further the additives used for preparing the composition (A), in the same manner to the preparation of the composition (A).

The electrodeposition coating process of photoresist for printed circuit board according to the present invention is generally conducted as follows.

The electrodeposition of the composition (A):

The electrodeposition coating bath composed of the composition (A) as dissolved or dispersed in water is maintained at a pH 6.0–9, bath concentration (solid content) 3–25 % by weight, preferably 5–20 % by weight and at a bath temperature of 15–40° C., preferably 15–30° C. Then into so maintained electrodeposition coating bath electroconductive boards are immersed, as an anode when the electrodeposition coating composition is anionic type, and as a cathode when the composition is cationic type; and either direct current of constant voltage of 5–400 V is applied or a direct current at constant current of 1–400 mA/dm$^2$ is applied. The predetermined voltage or current may be applied from the start of the electrodeposition, or they may be gradually raised to the predetermined level, for example, within 1 to 30 seconds from the start. In this case, suitable time during which the current is passed is from 30 seconds to 5 minutes.

After the electrodeposition coating, the coated substrate is withdrawn from the electrodeposition bath, rinsed with water, and then dried either as left standing or with such means as air-blowing or hot air blowing.

Thus obtained first coating of the photosensitive composition (A) has a film thickness within a range of, for negative type, 4–70 μm (preferably 5–50 μm) and for positive type, 2–50 μm (preferably, 3–20 μm). When the film thickness is less than 4 μm in case of negative type coating, it is apt to be affected by the oxygen and will have an inferior photocurability. On the other hand, when the thickness exceeds 70 μm, the electrodeposited coating tends to have uneven thickness and inferior surface smoothness. With positive type, with the film thickness less than 2 μm, protectivity of metal such as copper plating during etching is deteriorated, and at that exceeding 50 μm, development will become difficult.

So coated product is then immersed in an electrodeposition coating bath of the electrodeposition coating composition (B) which is maintained under similar conditions to above, and electrodeposition coated under the same conditions as above, except that the electrodeposition time is preferably from 10 seconds to 3 minutes. Withdrawn from the electrodeposition bath and rinsed with water, the product is then dried either as left standing or with such means as air-blowing or hot air blowing.

The film thickness of the second coating of the composition (B) is within a range of 0.5–30 μm (preferably 1–10 μm). When it is less than 0.5 μm, the first coating appreciably affect the surface characteristics thereof, e.g., if Tg of the first coating is low, the surface becomes tacky. Whereas, if it is more than 30 μm, the coated surface tends to become uneven. Suitable range of the total film thickness of the two coatings is, for negative type, 5–70 μm (preferably 5–50μm), and for positive type, 3–50 μm (preferably 3–20 μm). When the total thickness is less than the above lower limit, resistance to etching becomes deteriorated, and when it exceeds the upper limit, surface smoothness cannot be obtained and development of positive type coating tends to become difficult. It is preferred, in consideration of photosensitivity, to make first coating thick and the second coating, thin.

Then a pattern mask is applied onto the photosensitive, electrodeposition coating formed on the electroconductive plate like copper board, and the board is exposed to actinic rays such as ultraviolet rays.

When the photosensitive, electrodeposited coating is negative type, only the areas which are to serve as the conductor circuit are irradiated with the actinic rays, while when it is positive type, the areas other than the conductor circuit-forming portions are irradiated.

As the actinic rays to be employed for the exposure according to the present invention, normally those having wavelengths of 3,000 to 4,500 Å are suitable. As the light source, solar light, mercury lamp, xenon lamp, arc lamp, etc. may be used. Curing of the coating is effected within several minutes' irradiation of actinic rays, normally within the range of 1 second to 20 minutes.

The developing treatment of negative acting photoresist can be effected, when the electrodeposited coating is anionic type, by spraying weak aqueous alkali, and when it is cationic type, by spraying an aqueous acid of pH not higher than 5, onto the coating surface to wash off the uncured portions of the coating. The developing treatment of positive acting photoresist can be effected by spraying weak aqueous alkali.

With positive type electrodeposited coating, a heat treatment of the coated board at surface temperature of 100–180° C., preferably 120–160° C., for 1 second to 30 minutes, preceding the developing treatment is effective to promote insolubilization of unexposed areas to alkali and improve pattern-resolving ability.

The copper portions exposed on the base plate upon the developing treatment (non-circuit portions) can be removed by normal etching treatment using, for example, ferric chloride solution with anionic type nd alkaline solutions with cationic type. Thereafter the photocured coating or unexposed coating on the circuit pattern is removed by dissolving in cellosolve solvents like ethyl cellosolve, ethyl cellosolve acetate, etc.; aromatic hydrocarbon solvents like toluene, xylene, etc.; ketone solvents like methyl ethyl ketone, methyl isobutyl ketone, etc.; acetate solvents like ethyl acetate, butyl acetate, etc.; chloro-type solvents like trichloroethylene, etc. or 3–10% aqueous solutions of sodium hydroxide, potassium hydroxide, etc. (with cationic type electrodeposited coating, aqueous solution of acid), to form a printed circuit on the base board.

This invention concerns a 2-coat electrodeposition coating process which comprises coating on an electroconductive surface like copper plating a photosensitive electrodeposition composition having a lower glass transition temperature by an electrodeposition process, rinsing with water or aqueous effluent from ultrafiltration treatment, followed optionally by drying, and further applying onto the first coating an electrodeposition composition having a higher glass transition temperature to obtain a photoresist for printed circuit board. Because so obtained photoresist shows no surface tackiness, it is the optimum for contact exposure of films. More surprisingly, furthermore, there achieved such an effect that the photosensitivity is higher than the case of 1-coat electrodeposition coating, and the amount of exposure can be less.

Also by forming photoresists by two electrodeposition coatings like the present invention, printed circuit board perfectly free from the image deficiencies caused by waterdrop marks left after rinsing can be obtained. The precise mechanism of this effect is not yet fully clarified, but presumably the heat generated at the time of conducting the second electrodeposition coating imparts re-flowability to the first electrodeposition coating to repair the waterdrop marks.

[EXAMPLES]

Hereinafter the invention will be more specifically explained with reference to working Examples, in which parts and percents are by weight.

Production Examples of anionic electrodeposition coating bath

Production Example 1

A liquid mixture of 35 parts of methyl methacrylate, 45 parts of butyl acrylate, 20 parts of acrylic acid and 2 parts of azobisisobutyronitrile was added dropwise to 90 parts of propylene glycol monomethyl ether (hydrophilic solvent) maintained at 110° C. in nitrogen gaseous atmosphere, over 3 hours. Thereafter the system was aged for an hour. Into the system then a liquid mixture of one part of azobisdimethylvaleronitrile and 10 parts of propylene glycol monomethyl ether was added dropwise over an hour, followed by further 5 hours' aging. Thus a high acid value acrylic resin (acid value =155) solution was obtained. To the solution were then added 24 parts of glycidyl methacrylate, 0.12 part of hydroquinone and 0.6 part of tetraethylammonium bromide, and the system was reacted for 5 hours at 110° C. while air was blown into the system, to form a polymerizable unsaturated resin (acid value =about 50, unsaturation equivalent =about 740, number average molecular weight =about 20,000; Tg =about 5° C.) solution. This polymerizable unsaturated resin was neutralized with 0.6 equivalent of triethylamine, and thereafter 6 parts of alpha-hydroxyisobutylphenone was added as a photo polymerization initiator. To the system then water was added to make the solid content 10 %, to provide an electrodeposition coating bath (pH 7.0).

Production Example 2

A liquid mixture of 10 parts of styrene, 30 parts of n-butyl methacrylate, 30 parts of methyl acrylate, 30 parts of acrylic acid and 3 parts of azobisisobutyronitrile was added dropwise into 90 parts of cellosolve maintained at 120° C. in nitrogen gaseous atmosphere, over 3 hours. Thereafter the system was aged for an hour. Into the system then a liquid mixture of one part of azobisdimethylvaleronitrile and 10 parts of cellosolve was added dropwise over an hour, followed by further 5 hours' aging. Thus a high acid value acrylic resin (acid value =233) solution was obtained. To the solution were then added 35 parts of glycidyl methacrylate, 0.13 part of hydroquinone and 0.6 part of tetraethylammonium bromide, and the system was reacted for 5 hours at 110° C. while air was blown into the system, to form a photocurable resin (acid value=about 70, degree of unsaturation =about 1.83 mol/kg, Tg=25° C., number average molecular weight=about 15,000) solution.

This photocurable resin was neutralized with 0.6 equivalent of triethylamine, and thereafter 6 parts of alpha-hydroxyisobutylphenone was added as a photo polymerization initiator. To the system then water was added to make the solid content 10 % to provide an electrodeposition coating bath (pH 7.1).

Production Example 3

A mixture of 40 parts of methyl methacrylate, 25 parts of butyl acrylate, 15 parts of 2-hydroxyethyl methacrylate, 20 parts of acrylic acid and 2 parts of azobisisobutyronitrile was added dropwise to 100 parts of dioxane (hydrophilic solvent) which was maintained at 105° C., under a nitrogen gaseous atmosphere, consuming 2 hours. The system was further aged for an hour at the same temperature, to provide a high acid value acrylic resin (acid value=155) solution. To 200 parts of this solution then added was 20 parts of an equimolar addition product of 2-hydroxyethyl methacrylate and tolylene diisocyanate, followed by 5 hours' reaction in nitrogen gaseous atmosphere at 80° C. Thus a polymerizable unsaturated resin (acid value=about 120, unsaturation equivalent =about 1,800, number average molecular weight= about 20,000 and Tg=about 20° C.) solution useful for the present invention was obtained. After neutralizing this polymerizable unsaturated resin with 0.6 equivalent of dimethylaminoethanol, 6 parts of benzoin ethyl ether as a photopolymerization initiator was added to the solution, followed by addition of water to make the solid content 10 %, to provide an electrodeposition coating bath (pH 7.2).

Production Example 4

An esterification reaction was conducted in a mixed system of 390 parts of Epikote No. 828 (tradename of a product of Shell Chemical K.K.) and 1120 parts of linseed oil fatty acid, in a nitrogen gaseous atmosphere, at 220-230° C., until the acid value was reduced to not higher than 10. Thereafter the temperature was lowered to 80° C., and 392 parts of maleic anhydride was added. The temperature was again gradually raised to 230° C., and at said temperature maleinizing reaction was effected for about 2 hours. Then the temperature was dropped to 180° C., at which 300 parts of n-butanol was added to open the acid anhydride rings, to provide a vehicle component useful for the present invention (acid value=about 100, unsaturation equivalent=about 250, number average molecular weight=about 2,000, Tg=5° C.).

The vehicle component was dissolved in ethylene glycol monobutyl ether (hydrophilic solvent) to make a solution having vehicle component content of 70 %, which was then neutralized with 0.6 equivalent of triethylamine, added with 5 % (to the vehicle component) of benzoin ethyl ether, and then with water until the solid content became 10 %. Thus an electrodeposition coating bath (pH 8.5) was obtained.

Production Example 5

Production Example 1 was repeated except that the butyl acrylate was replaced by butyl methacrylate. Tg of this resin is 50° C.

Production Example 6

Production Example 3 was repeated except that the butyl acrylate was replaced by ethyl methacrylate. Tg of this resin is 70° C.

Production Example 7

A liquid mixture of 40 parts of methyl methacrylate, 35 parts of ethyl methacrylate, 15 parts of 2-hydroxyethyl methacrylate, 10 parts of acrylic acid and 2 parts of azobisisobutyronitrile was added dropwise to 100 parts of dioxane (hydrophilic solvent) maintained at 105° C. in nitrogen gaseous atmosphere, over 3 hours. Thereafter the system was aged for an hour at the same temperature. Whereby obtained was an acrylic resin (acid value=75, Tg=65° C.) solution. This resin was neutralized with 0.6 equivalent of triethylamine, and then water was added to make the solid content 10%, to provide an electrodeposition coating bath (pH 7.3).

Example 1

Using the electrodeposition coating bath of Production Example 1, copper plating board for printed circuit board (100×200×1.6 mm) having 0.4 mm and 6 mm through holes was electrodeposition coated, by using the board as anode, at a bath temperature of 25° C., with 3 minutes' passage of 100 V direct current. The coating was rinsed with water and dried at 70° C., for 2 minutes to provide a 30 μm-thick smooth photosensitive coating. So coated board was further given an electrodeposited coating thereon in the electrodeposition coating bath of Production Example 5, at a bath temperature of 25° C., by one minute's passage of 120 V direct current. The coating was rinsed with water and dried for 5 minutes at 70° C. A smooth, total 33 μm-thick 2-coat photosensitive coating having no sagging from the through holes and no surface tackiness was obtained. Then a negative film was contacted with this coated board in a vacuum apparatus at a room temperature of 25° C., and both sides of the system was irradiated with ultraviolet rays (UV) from a 3 KW extra high voltage mercury lamp.

Examples 2–5 and Comparative Examples 1–7

Photosensitive coatings were obtained similarly to Example 1, using the electrodeposition coating baths and under the conditions, both indicated in Table 1 below, which were UV-irradiated in the similar manner to Example 1.

TABLE 1

| | | Example | | | | Comparative Example |
|---|---|---|---|---|---|---|
| Electrodeposition conditions | | 2 | 3 | 4 | 5 | 1 |
| Electrodeposition coating bath for first coating | | Production Example 2 | Production Example 2 | Production Example 3 | Production Example 4 | Production Example 1 |
| Electrodeposition coating conditions | Bath temp. (°C.) | 25 | 25 | 25 | 25 | 25 |
| | Electric current applied (D.C.) | 60 mA/dm² | 60 mA/dm² | 50 mA/dm² | 50 mA/dm² | 100 V |
| | Current application time (min.) | 3 | 3 | 3 | 3 | 3 |
| | Drying conditions | air-dried | air-dried | 70° C., 2 min. | 70° C., 2 min. | 70° C., 2 min. |
| | Coating thickness (μm) | 20 | 20 | 15 | 17 | 17 |
| Electrodeposition coating bath for second coating | | Production Example 5 | Production Example 7 | Production Example 6 | Production Example 6 | |
| Electrodeposition coating conditions | Bath temp. (°C.) | 25 | 25 | 25 | 25 | |
| | Electric current applied (D.C.) | 100 V | 100 V | 100 V | 100 V | |
| | Current application time (min.) | 2 | 2 | 2 | 2 | |
| | Drying conditions | 70° C., 5 min. | 70° C., 5 min. | 70° C., 5 min. | 70° C., 5 min. | |
| | Total 2-coat coating thickness (μm) | 30 | 23 | 20 | 23 | |

| | | Comparative Example | | | | | |
|---|---|---|---|---|---|---|---|
| Electrodeposition conditions | | 2 | 3 | 4 | 5 | 6 | 7 |
| Electrodeposition coating bath for first coating | | Production Example 2 | Production Example 5 | Production Example 2 | Production Example 2 | Production Example 3 | Production Example 6 |
| Electrodeposition coating conditions | Bath temp. (°C.) | 25 | 25 | 25 | 25 | 25 | 25 |
| | Electric current applied (D.C.) | 60 mA/dm² | 60 mA/dm² | 60 mA/dm² | 60 mA/dm² | 50 mA/dm² | 60 mA/dm² |
| | Current application time (min.) | 3 | 4 | 3 | 3 | 3 | 3 |
| | Drying conditions | air-dried | 70° C., 5 min. | air-dried | air-dried | 70° C., 2 min. | 70° C., 5 min. |
| | Coating thickness (μm) | 20 | 20 | 20 | 20 | 15 | 10 |
| Electrodeposition coating bath for second coating | | | | Production Example 5 | Production Example 7 | | |

| | | immersion coating, solid content of bath: 2% | roll coater-coating |
|---|---|---|---|
| Electro-deposition coating conditions | Bath temp. (°C.) Electric current applied (D.C.) Current application time (min.) Drying conditions Total 2-coat coating thickness (μm) | 70° C., 10 min. 22 | 70° C., 10 min. 25 |

Production Examples of cationic electrodeposition coating bath

Production Example 8

A liquid mixture of 30 parts of methyl methacrylate, 35 parts of butyl acrylate, 35 parts of glycidyl methacrylate and 2 parts of azobisisobutyronitrile was added dropwise to 90 parts of propylene glycol monomethyl ether (hydrophilic solvent) maintained at 110° C. in nitrogen gaseous atmosphere, over 3 hours. Thereafter the system was aged for an hour. Into the system then a liquid mixture of one part of azobisdimethylvaleronitrile and 10 parts of propylene glycol monomethyl ether was added dropwise over an hour, followed by further 5 hours' aging. Thus a glydicyl groupcontaining acrylic resin solution was obtained. To the solution were then added 10 parts of acrylic acid, 0.12 part of hydroquinone and 0.6 part of tetraethylammonium bromide, and the system was reacted for 5 hours at 110° C. while air was blown into the system. Then the system was cooled to 50° C., added with 8.0 parts of methyl aminoethanol, and reacted at 70° C. for 2 hours to provide a tertiary amino-containing polymerizable unsaturated resin (amino group content=about 0.91 mol/kg, unsaturation equivalent=about 850, number average molecular weight =about 20,000; Tg=about 6° C.) solution. This polymerizable unsaturated resin was neutralized with 0.6 equivalent of acetic acid, and thereafter 6 parts of alpha-hydroxyisobutylphenone was added as a photo polymerization initiator. To the system then water was added to make the solid content 10 %. Thus an electrodeposition coating bath (pH 6.7) was obtained.

Production Example 9

A liquid mixture of 30 parts of glycidyl methacrylate, 5 parts of styrene, 24 parts of n-butyl methacrylate, 23 parts of methyl acrylate, 18 parts of dimethylaminoethyl methacrylate and 5 parts of azobisisovaleronitrile was added dropwise to 90 parts of cellosolve maintained at 80° C. in nitrogen gaseous atmosphere, over 3 hours. Thereafter the system was aged for an hour. Into the system then a liquid mixture of one part of azobisdimethylvaleronitrile and 10 parts of cellosolve was added dropwise over an hour, followed by further 5 hours' aging. Thus an acrylic resin solution was obtained. To the solution were then added 15 parts of acrylic acid and 0.13 part of hydroquinone, and the system was reacted or 5 hours at 110° C. while air was blown into the system, to form a photocurable resin (amino group content=about 1.0 mol/kg, unsaturation equivalent=about 545, Tg=20° C., number average molecular weight=about 15,000) solution.

This photocurable resin was neutralized with 0.6 equivalent of formic acid, and thereafter 6 parts of alpha-hydroxyisobutylphenone was added as a photo polymerization initiator. To the system then water was added to make the solid content 10 % to provide an electrodeposition coating bath (pH 6.5).

Production Example 10

A mixture of 35 parts of methyl methacrylate, 20 parts of butyl acrylate, 15 parts of 2-hydroxyethyl methacrylate, 30 parts of dimethylaminoethyl methacrylate and 2 parts of azobisisobutyronitrile was added dropwise to 100 parts of dioxane (hydrophilic solvent) which was maintained at 105° C., under a nigrogen gaseous atmosphere, consuming 2 hours. The system was aged for an hour at the same temperature, to provide an acrylic resin solution. To 200 parts of this solution then added was 20 parts of an equimolar addition product of 2-hydroxyethyl methacrylate and tolylene diisocyanate, followed by 5 hours' reaction at 80° C. Thus a polymerizable unsaturated resin (tertiary amino group content=about 1.6 mols/kg, unsaturation equivalent=about 1,800, number average molecular weight=about 20,000 and Tg=about 22° C.) solution useful for the present invention was obtained. After neutralizing this polymerizable unsaturated resin with 0.6 equivalent of acetic acid, 6 parts of benzoin ethyl ether as a photopolymerization initiator was added to the solution, followed by addition of water to make the solid content 10 %, to provide an electrodeposition coating bath (pH 6.3).

Production Example 11

An esterification reaction was conducted in a mixed system of 960 parts of Epikote No. 1001 (tradename of a product of Shell Chemical K. K.), 115 parts of acrylic acid, 0.8 part of hydroquinone and 3 parts of tetraethylammonium bromide, as added to 350 parts of butyl cellosolve, while blowing air thereinto at 110° C., until the acid value was reduced to not higher than 1. Thereafter the temperature was lowered to 50° C., and to the system 36 parts of dimethylaminoethanol and 24 parts of acetic acid were added, followed by 4 hours' reaction at 70° C. to obtain a quaternary ammonium base-containing unsaturated resin (quaternary ammonium base content=about 0.35 mol/kg, unsaturation equivalent=-about 720, number average molecular weight=about 1,200, Tg=10° C.).

To this unsaturated resin, 5 % (to the vehicle component) of benzoin ethyl ether was added, and then water was added until the solid content became 10 %. Thus an electrodeposition coating bath (pH 7.8) was obtained.

Production Example 12

Production Example 8 was repeated except that the butyl acrylate was replaced by butyl methacrylate. Tg of this resin is 52° C.

Production Example 13

Production Example 10 was repeated except that the butyl acrylate was replaced by ethyl methacrylate. Tg of this resin is 72° C.

Production Example 14

A liquid mixture of 35 parts of methyl methacrylate, 30 parts of ethyl methacrylate, 15 parts of 2-hydroxyethyl methacrylate, 20 parts of dimethylaminoethyl methacrylate and 2 parts of azobisisobutyronitrile was added dropwise to 100 parts of dioxane (hydrophilic solvent) maintained at 105° C. in nitrogen gaseous atmosphere, over 3 hours. Thereafter the system was aged for an hour at the same temperature. Whereby obtained was an acrylic resin (tertiary amino group content=1.3 mols/kg, Tg=65° C.) solution. This resin was neutralized with 0.6 equivalent of acetic acide, and then water was added to make the solid content 10%, to provide an electrodeposition coating bath (pH 6.5).

Examples 6–10 and Comparative Examples 8–14

Photosensitive coatings were obtained similarly to Example 1 except that the copper plating boards were used as cathode, using the electrodeposition coating baths and under the conditions, both indicated in Table 2 below, which were UV-irradiated.

TABLE 2

| | | Example | | | | |
|---|---|---|---|---|---|---|
| Electrodeposition conditions | | 6 | 7 | 8 | 9 | 10 |
| Electrodeposition coating bath for first coating | | Production Example 8 | Production Example 9 | Production Example 9 | Production Example 10 | Production Example 11 |
| Electrodeposition coating conditions | Bath temp. (°C.) | 25 | 25 | 25 | 25 | 25 |
| | Electric current applied (D.C.) | 100 V | 60 mA/dm$^2$ | 60 mA/dm$^2$ | 50 mA/dm$^2$ | 50 mA/dm$^2$ |
| | Current application time (min.) | 3 | 3 | 3 | 3 | 3 |
| | Drying conditions | 70° C., 2 min. | air-dried | air-dried | 70° C., 2 min. | 70° C., 2 min. |
| | Coating thickness (μm) | 30 | 20 | 20 | 15 | 15 |
| Electrodeposition coating bath for second coating | | Production Example 12 | Production Example 12 | Production Example 14 | Production Example 13 | Production Example 13 |
| Electrodeposition coating conditions | Bath temp. (°C.) | 25 | 25 | 25 | 25 | 25 |
| | Electric current applied (D.C.) | 120 V | 100 V | 100 V | 120 V | 120 V |
| | Current application time (min.) | 1 | 2 | 2 | 1 | 1 |
| | Drying conditions | 70° C., 5 min. | 70° C., 5 min. | 70° C., 5 min. | 70° C., 5 min. | 70° C., 5 min. |
| | Total 2-coat coating thickness (μm) | 33 | 30 | 23 | 20 | 25 |

| | | Comparative Example | | | | | | |
|---|---|---|---|---|---|---|---|---|
| Electrodeposition conditions | | 8 | 9 | 10 | 11 | 12 | 13 | 14 |
| Electrodeposition coating bath for first coating | | Production Example 8 | Production Example 9 | Production Example 12 | Production Example 9 | Production Example 9 | Production Example 10 | Production Example 13 |
| Electrodeposition coating conditions | Bath temp. (°C.) | 25 | 25 | 25 | 25 | 25 | 25 | 25 |
| | Electric current applied (D.C.) | 100 V | 60 mA/dm$^2$ | 60 mA/dm$^2$ | 60 mA/dm$^2$ | 60 mA/dm$^2$ | 60 mA/dm$^2$ | 60 mA/dm$^2$ |
| | Current application time (min.) | 3 | 3 | 4 | 3 | 3 | 3 | 3 |
| | Drying conditions | 70° C., 2 min. | air-dried | 70° C., 5 min. | air-dried | air-dried | 70° C., 2 min. | 70° C., 5 min. |
| | Coating thickness (μm) | 30 | 20 | 20 | 20 | 20 | 15 | 10 |
| Electrodeposition coating bath for second coating | | | | | | Production Example 12 | Production Example 14 | |
| Electrodeposition coating conditions | Bath temp. (°C.) Electric current applied (D.C.) | | | | | immersion coating, solid content of bath: 2% | roll coater-coating | |
| | Current application time (min.) | | | | | | | |
| | Drying conditions | | | | | 70° C., 10 min. | 70° C., 10 min. | |
| | Total 2-coat coating thickness (μm) | | | | | 25 | 25 | |

After the contact exposure of negative films in Examples 1–10 and Comparative Examples 1–14, ease of the negative film separation, amount of exposure, washing-out development of unexposed portions with weak alkali or acid, etching removal of copper with ferric chloride (anionic type) or with an alkaline etching solution (cationic type) after rinsing with water, peeling-off of the cured coating film on exposed portions, and the pattern condition of printed circuit board were examined. The results are shown in later appearing Table 3.

Amount of exposure:

The minimum amount of exposure to secure 200-μm width line forming a sharp cured coating film after development (accumulated amount of light at 375 nm: mJ/cm²).

Development:

The state of the unexposed portions of the coating films after being washed by 2 minutes' spraying of 1 % sodium carbonate solution onto the coating film of anionic type resins (or 3 % acetic acid solution in case of cationic resins) at 25° C.

Etching removal:

The surface state and the inside state of the through holes after exposure was carried out until coating of the through holes were cured, followed by development, rinsing and 3 minutes' spraying of 50° C. ferric chloride solution.

Peeling off:

Extent of peeling-off of the cured coating films after 3 minutes' spraying of 50° C., 3 % sodium hydroxide solution if the resin composition forming the films was anionic type, or 10 % lactic acid solution if the composition was cationic type.

Pattern condition of printed circuit board:

It was examined if the required circuits were precisely formed.

TABLE 3

| | | Ex. 1 | Ex. 2 | Ex. 3 | Comp. Ex. 1 | Comp. Ex. 2 | Com. Ex. 3 | Comp. Ex. 4 |
|---|---|---|---|---|---|---|---|---|
| Ease of film separation | | good | good | good | adhered and in- separable | partially adhered and difficult of separation | good | good |
| Amount of exposure mJ/cm² | 200 μm-wide pattern | 50 | 50 | 50 | — | 70 | 300 | 70 |
| | Inside of 0.4 mm through holes | 300 | 300 | 300 | — | 400 | 1500 | 1500 |
| Development | | good | good | good | — | — | good | good |
| Etching treat- ment | Surface | good | good | good | — | — | good | good |
| | Inside of through holes | good | good | good | — | — | good | good |
| Peeling | | good | good | good | — | — | good | cured coating detained in through holes insufficient elimination of coating inside through holes |
| Pattern condition | | good | good | good | — | pattern con- tains dull portions | good | |

| | | Comp. Ex. 5 | Ex. 4 | Ex. 5 | Comp. Ex. 6 | Comp. Ex. 7 |
|---|---|---|---|---|---|---|
| Ease of film separation | | good | good | good | partially adhered and difficult of separation | good |
| Amount of exposure mJ/cm² | 200 μm-wide pattern | 70 | 50 | 170 | 70 | 400 |
| | Inside of 0.4 mm through holes | not cured at 2000 mJ/cm² | 300 | 500 | 400 | 2000 |
| Development | | good | good | good | good | good |
| Etching treat- ment | Surface | good | good | good | good | good |
| | Inside of through holes | all copper- foil removed by etching | 300 | good | good | good |
| Peeling | | good | good | good | good | good |
| Pattern condition | | not good | good | good | pattern con- tains dull portions | good |

| | | Ex. 6 | Ex. 7 | Ex. 8 | Comp. Ex. 8 | Comp. Ex. 9 | Com. Ex. 10 | Comp. Ex. 11 |
|---|---|---|---|---|---|---|---|---|
| Ease of film separation | | good | good | good | adhered and in- seperable | partially adhered and difficult of separation | good | good |
| Amount of exposure mJ/cm² | 200 μm-wide pattern | 40 | 50 | 50 | — | 70 | 200 | 70 |
| | Inside of 0.4 mm through holes | 300 | 300 | 300 | — | 400 | 1500 | 1500 |
| Development | | good | good | good | — | — | good | good |
| Etching treat- ment | Surface | good | good | good | — | — | good | good |
| | Inside of through holes | good | good | good | — | — | good | good |

TABLE 3-continued

| | | | | | | | |
|---|---|---|---|---|---|---|---|
| Peeling | | good | good | good | — | — | good | cured coating detained in through holes insufficient elimination |
| Pattern condition | | good | good | good | — | pattern contains dull portions | good | of coating inside through holes |

| | | Comp. Ex. 12 | Ex. 9 | Ex. 10 | Comp. Ex. 13 | Comp. Ex. 14 |
|---|---|---|---|---|---|---|
| Ease of film separation | | good | good | good | partially adhered and difficult of separation | good |
| Amount of exposure mJ/cm² | 200 μm-wide pattern | 70 | 60 | 70 | 70 | 400 |
| | Inside of 0.4 mm through holes | not cured at 2000 mJ/cm² | 300 | 400 | 400 | 2000 |
| Development | | good | good | good | good | good |
| Etching treatment | Surface | good | good | good | good | good |
| | Inside of through holes | all copper-foil removed by etching | good | good | good | good |
| Peeling | | good | good | good | good | good |
| Pattern condition | | not good | good | good | pattern contains dull portions | good |

Production Examples of electrodepositoin coating baths for forming positive type photoresists Production Example 15

A four-necked flask was charged with 290 parts of diethylene glycol dimethyl ether, and with stirring the temperature was raised to 110° C. Then, a mixture of 202 parts of n-butyl methacrylate, 24 parts of acrylic acid, 92 parts of m-isopropenyl-alpha,alpha-dimethylbenzyl isocyanate and 20 parts of azobisbutyrovaleronitrile was added dropwise over the course of 3 hours. The mixture was aged for an hour, and a mixture of 14 parts of methyl isobutyl ketone and 3 parts of azobisbutyrovaleronitrile was added dropwise, consuming an hour, followed by 2 hours' aging. Thereafter, the temperature was lowered to 50° C., and 142 parts of the hydroxyl-containing ortho-quinonediazide compound and 4.6 parts of dibutyltin diacetate were added. After 3 hours' aging, it was confirmed that the absorption of the isocyanate group near 2250 cm$^{-1}$ in the infrared spectrum no more existed. Thus a positive type photosensitive resin (acid value=40.7, viscosity=E, number average molecular weight=7,000) was obtained (the viscosity was in all cases measured with Gardner's viscometer at 25° C.). After completely neutralizing this photosensitive resin solution with 33 parts of triethylamine, deionized water was added to make the solid content 10 %, to provide an electrodeposition coating bath (pH=8.0).

Preparation of hydroxyl-containing o-quinonediazide compound

A four-necked flask was charged with 269 parts of ortho-naphthoquinonediazide sulfonyl chloride and 1345 parts of dioxane, and with stirring at room temperature, 150 parts of N-methylethanolamine was added dropwise over an hour. After the dropwise addition, the mixture was stirred further for about 3 hours. Upon confirming disappearance of the absorption by amino group near 3300 cm$^{-1}$ in the IR spectrum of the reaction mixture, the reaction was terminated.

The resulting solution was put in deionized water, and the quaternary amine which trapped hydrochloric acid formed during the reaction was removed. The product was then extracted with isobutyl acetate, and the solvent was distilled off. The residue was dried in a dessicator under reduced pressure. Thus a hydroxyl-containing ortho-quinonediazide compound was obtained.

Production Example 16

A four-necked flask was charged with 450 parts of ethylene glycol monobutyl ether, and its temperature was raised to 110° C. under stirring. Thereafter a liquid mixture of 350 parts of methyl methacrylate, 50 parts of styrene, 53 parts of ethyl methacrylate, 47 parts of acrylic acid and 30 parts of t-butylperoxyoctoate was added dropwise to the system, consuming 3 hours. After maintaining the system at 110° C. for an hour, a liquid mixture of 3 parts of t-butylperoxyoctoate and 50 parts of ethylene glycol monobutyl ether was added dropwise over an hour, followed by further 2 hours' aging at 110° C. Thus a high acid value acrylic resin solution (acid value=73, viscosity=U, number average molecular weight=7,500) was obtained.

To 1000 parts of this solution were then added 50 parts of benzyl alcohol and 36 parts of triethylamine so as to completely neutralize the solution, and then deionized water was added to make the solid content 10 %. Thus an electrodeposition coating bath (pH 7.6) was obtained.

Example 11

Using the electrodeposition coating bath of Production Example 15, a copper plating board for printed circuit board (240×170×1.5 mm) having through holes was electrodeposition coated, by using the board as anode, at a bath temperature of 25° C., with 3 minutes' passage of 100 V direct current. The coating was showered with water under a hydraulic pressure of 1.5 kg/cm² for 10 seconds and dried at 50° C. for 5 minutes.

The waterdrop traces on the coating (5μm in thickness) were marked.

Thus obtained board was immersed as an anode in the electrodeposition coating bath of Production Example 16 maintained at 25° C., and a 110 V direct electric current was applied for 3 minutes to effect the second electrodeposition coating. The coating was rinsed with water in the manner similar to the above, and dried for 5 minutes at 50° C. The total thickness of the two coatings was 6 μm.

Then a positive film with a pattern width 0 μm/200 μm (line/space) and 0.4 mm through holes was contacted with this coated surface, and both sides were irradiated at a dosage of 150 mJ/cm² with a 3 KW extra high voltage mercury lamp. Then the exposed surfaces were developed with 1% aqueous sodium metasilicate solution. After rinsing with water, the copper foil was removed by etching treatment with ferric chloride solution, and then unexposed portions were removed with sodium hydroxide to provide a printed circuit board.

In this manner 20 sheets of printed circuit board were prepared and examined. It was confirmed that occurrence of breaking or lacking in line at the marked spots of waterdrop marks was nil.

Examples 12-13

Positive type photoresists were formed in the manner similar to Example 11 except that copper plated board having no through holes were used. After exposure, the photoresists were heat-treated before development at 90° C. for 20 minutes (Example 12) or at 150° C. for 3 minutes (Example 13). Circuit boards were obtained therefrom in the manner similar to Example 11, using a photo mask having test patterns with line widths 20 μm/20 μm-200 μm/200 μm (line/space). The resolving power of the resultant circuit patterns was evaluated, with the result as shown in Table 4. Resolving power is indicated with the minimum pattern width at which each width of lines and spaces were precisely reproduced as the lines.

TABLE 4

|  | Heating conditions | Resolving power (line/space) |
|---|---|---|
| Example 11 | normal temperature | 50 μm/50 μm |
| Example 12 | 90° C., 20 minutes | 35 μm/35 μm |
| Example 13 | 150° C., 30 minutes | 20 μm/20 μm |

We claim:

1. An electrodeposition coating process of a photoresist for printed circuit board which comprises electrodeposition coating on a conductive surface a photosensitive electrodeposition coating composition (A), and thereafter further electrodeposition coating on the resultant coated plate an electrodeposition coating composition (B) composed chiefly of water-soluble or water-dispersible resin having a glass transition temperature (Tg) not lower than 20° C.

2. A process as defined in claim 1, in which the electrodeposition coating compositions (A) and (B) are negative type electrodeposition coating compositions containing as the chief ingredients water-soluble or water-dispersible polymerizable unsaturated resin and photo-polymerization initiator.

3. A process as defined in claim 2, in which the polymerizable unsaturated resin is an anionic or cationic resin having unsaturation equivalent of 150-3,000 and number average molecular weight of at least 300.

4. A process as defined in claim 3, in which the polymerizable unsaturated resin is an anionic resin formed by adding to a high acid value acrylic resin a compound containing in one molecule a polymerizable unsaturated bond and a glycidyl group.

5. A process as defined in claim 1, in which the electrodeposition coating compositions (A) and (B) are positive type electrodeposition coating compositions of which chief ingredients are water-soluble or waterdispersible resins containing photosensitive groups.

6. A process as defined in claim 5, in which the resin containing photosensitive groups contains, as the photosensitive groups, 5-60 wt % to the resin of benzoquinonediazide units or naphthoquinonediazide units.

7. A process as defined in claim 1, in which the electrodeposition coating composition (B) is composed chiefly of non-photocrosslinkable resin having no photosensitive groups.

8. A process as defined in claim 7, in which the non-photocrosslinkable resin containing no photosensitive groups is the polymerizable unsaturated resin from which polymerizable unsaturated groups have been removed.

9. A process as defined in claim 1, in which the resin used in the electrodeposition coating composition (A) has a glass transition temperature (Tg) of −50° to 60° C.

10. A process as defined in claim 1, in which the resin used in the electrodeposition coating composition (B) has a glass transition temperature (Tg) of from 40° to 120° C.

11. A process as defined in claim 1, in which Tg of the resin used for electrodeposition coating composition (B) is higher than that of the resin used for electrodeposition coating composition (A) by at least 5° C.

12. A process as defined in claim 2, in which the film thicknesses of the coatings formed of the negative type electrodeposition coating compositions (A) and (B) are, respectively, 4-70μm and 0.5-30μm, and the total thickness of the two coatings is 5-70μm.

13. A process as defined in claim 5, in which the film thicknesses of the coatings formed of the positive type electrodeposition coating compositions (A) and (B) are, respectively, 2-50μm and 0.5-30μm, and the total thickness of the two coatings is 3-50μm.

14. A process as defined in claim 5, in which the positive type electrodeposition coating composition (B) is heat-treated after it is applied.

15. A process as defined in claim 14, in which the heat-treating conditions comprise surface temperature of 100° to 180° C. and heating time of from 1 second to 30 minutes.

16. Photoresist for printed circuit board electrodeposition coated by the claimed processes.

* * * * *